US009170615B2

(12) United States Patent
Wilke et al.

(10) Patent No.: US 9,170,615 B2
(45) Date of Patent: Oct. 27, 2015

(54) COMPACT NETWORK SERVER OR APPLIANCE

(71) Applicant: RadiSys Corporation, Hillsboro, OR (US)

(72) Inventors: Jeffrey D. Wilke, Palmer Lake, CO (US); Lawrence A. Freymuth, Colorado Springs, CO (US); James G. Bringley, Columbia, SC (US); Israel D. Dubin, Boca Raton, FL (US); Robert A. Pebly, Beaverton, OR (US); James M. Yoder, Beaverton, OR (US)

(73) Assignee: RadiSys Corporation, Hillsboro, OR (US)

( * ) Notice: Subject to any disclaimer, the term of this patent is extended or adjusted under 35 U.S.C. 154(b) by 454 days.

(21) Appl. No.: 13/662,981

(22) Filed: Oct. 29, 2012

(65) Prior Publication Data

US 2013/0107454 A1    May 2, 2013

Related U.S. Application Data

(60) Provisional application No. 61/553,738, filed on Oct. 31, 2011.

(51) Int. Cl.
*H05K 7/20* (2006.01)
*G06F 1/18* (2006.01)
*G06F 1/20* (2006.01)

(52) U.S. Cl.
CPC ............... *G06F 1/184* (2013.01); *G06F 1/185* (2013.01); *G06F 1/187* (2013.01); *G06F 1/188* (2013.01); *G06F 1/20* (2013.01); *H05K 7/20727* (2013.01)

(58) Field of Classification Search
None
See application file for complete search history.

(56) References Cited

U.S. PATENT DOCUMENTS 5,694,294 A * 12/1997 Ohashi et al. ............. 361/679.48
6,618,248 B1 * 9/2003 Dalheimer ............... 361/679.33
6,704,196 B1 * 3/2004 Rodriguez et al. ........ 361/679.33

(Continued)

FOREIGN PATENT DOCUMENTS

KR    1020060093138 A    8/2006

OTHER PUBLICATIONS

Notification of Transmittal of the International Search Report and the Written Opinion of the International Searching Authority, or the Declaration, for PCT/US2012/062376, filed Oct. 29, 2012.

*Primary Examiner* — Courtney Smith
(74) *Attorney, Agent, or Firm* — Stoel Rives (57) ABSTRACT

A rack mount network appliance may include a chassis that includes a front compartment proximal a front side of the chassis and a rear compartment proximal a rear side of the chassis. The chassis may be configured to be mounted in an appliance rack. A front vent on the front side of the chassis may be configured to allow air to flow between an external environment and the front compartment. A front loading module mountable in the front compartment may include a heat generating device. A front loading airflow module may be configured to draw in air within the front compartment into the front loading airflow module in a first direction and force air out of the front loading airflow module into the rear compartment in a second direction such that air is drawn in the front vent, over the heat generating device of the front loading module, and forced rearward over rear heat generating devices and out a rear vent of the chassis. The first direction may be substantially orthogonal to the second direction.

24 Claims, 3 Drawing Sheets

(56) References Cited

U.S. PATENT DOCUMENTS

| | | | |
|---|---|---|---|
| 7,403,385 B2 * | 7/2008 | Boone et al. | 361/692 |
| 7,593,223 B2 * | 9/2009 | Kobayashi | 361/695 |
| 7,760,498 B2 * | 7/2010 | Shan et al. | 361/695 |
| 7,843,685 B2 * | 11/2010 | Beauchamp et al. | 361/679.49 |
| 8,854,815 B2 * | 10/2014 | Tambe | 361/695 |
| 2004/0184233 A1 * | 9/2004 | Yamada | 361/690 |
| 2005/0153649 A1 | 7/2005 | Bettridge et al. | |
| 2008/0212273 A1 | 9/2008 | Bechtolsheim | |
| 2009/0305625 A1 | 12/2009 | Dawson et al. | |
| 2010/0315788 A1 | 12/2010 | Vanderveen et al. | |

* cited by examiner

COMPACT NETWORK SERVER OR APPLIANCE

RELATED APPLICATIONS

This application claims the benefit under 35 U.S.C. §119(e) of U.S. Provisional Patent Application No. 61/553,738, titled "Compact Network Server and/or Appliance," filed Oct. 31, 2011, which is hereby incorporated by reference herein in its entirety.

TECHNICAL FIELD

The present disclosure relates to rack mount servers and network appliances and more particularly relates to compact sized rack mount servers and network appliances.

SUMMARY

A rack mount network appliance may include a chassis that includes a front compartment proximal a front side of the chassis and a rear compartment proximal a rear side of the chassis. The chassis may be configured to be mounted in a network rack. A front vent on the front side of the chassis may be configured to allow air to flow between an external environment and the front compartment. A front loading module mountable in the front compartment may include a heat generating device. A front loading airflow module may be configured to draw in air within the front compartment into the front loading airflow module in a first direction and force air out of the front loading airflow module into the rear compartment in a second direction such that air is drawn in the front vent, over the heat generating device of the front loading module, and forced rearward over rear heat generating devices and out a rear vent of the chassis. The first direction may be substantially orthogonal to the second direction.

BRIEF DESCRIPTION OF THE DRAWINGS

Understanding that drawings depict only certain embodiments and are not therefore to be considered to be limiting in nature, non-limiting and non-exhaustive embodiments of the disclosure are described and explained with additional specificity and detail through the use of the accompanying drawings.

DETAILED DESCRIPTION OF PREFERRED EMBODIMENTS

Rack mount network appliances, such as servers, are often used for high density processing, communication, or storage needs. For example, a telecommunications center may include racks in which network appliances provide communication and processing capabilities as services to customers. The network appliances generally have standardized heights, widths, and depths to allow for uniform rack sizes and easy mounting, removal, or serviceability of the mounted network appliances. In some situations, standards defining locations and distances between mounting holes may be specified. Often, due to the hole spacing, network appliances are approximately multiples of a specific minimum height. For example, a network appliance with a minimum height may be referred to as one unit (1 U) high while a network appliance with about twice or three times the minimum height are referred to as 2U or 3U, respectively. Thus, a 2U network appliance is about twice as tall as a 1U case while a 3U network appliance is about three times as tall as the 1U case. Because the standard size for the racks and the network appliances may be replicated over large areas for large data centers or telecommunication centers, any space savings for the dimensions of a network appliance can lead to significant space and cost reductions.

Rack mount network appliances often include chassis that are configured to house a variety of different components. For example, a rack mount server may be configured to house a motherboard, power supply, and/or other components. Additionally, the server may be configured to allow installation of expansion components such as processor, storage, or input/output (I/O) modules which can expand or increase the server's capabilities. A network appliance chassis may be configured to house a variety of different printed circuit board (PCB) cards having varying lengths. In some embodiments, coprocessor modules may have lengths of up to thirteen inches while I/O modules and/or storage modules may have lengths of up to six inches.

In addition to housing processing, communication, and/or storage components a rack mount network appliance will generally also house fans, blowers, or other devices to provide airflow through the network appliance. Sufficient airflow is an important aspect for the proper operation of a device as well as for safety of individuals or buildings in which the servers or network appliances are installed. Heat management is especially important with high performance network appliances in large data centers or telecommunication centers.

Frequently, the fans or other devices used to provide airflow through the server or network appliance are used internal to or in conjunction with air plenums that occupy space within a network appliance and may lead to an increase in the depth, height, or overall size of the network appliance. Frequently, the use of the fan and air plenums results in an increased depth of a network appliance or server. For example, a fan may be placed within an air plenum that exclusively occupies about three or more inches of the depth of a network appliance chassis. Thus, rack mount network appliances often have lengths to accommodate the length of a six inch PCBs, such as I/O modules or storage modules, plus a length of a thirteen inch PCBs, such as coprocessor modules, and plus a length of an air plenum with fan. As such, rack mount servers or fans generally have a length of about 24 inches or more.

In some situations, fans on vents near on the front or rear of a network appliance may be used to reduce the amount of depth occupied by a fan or taken up by an air plenum. However, fans occupying a front or rear may limit the amount of space that can be used for front or rear loading modules, which can decrease serviceability of some modules or components. In some situations, improved serviceability of a server or specific components of a server can save significant time for an administrator or technician and may allow for reduced down time for repairs or other service. For example, it may be desirable to be able to quickly swap modules, replaced a failed component, or perform other service on the server or network appliance to provide seamless service and/or to reduce management costs. As such, some servers or network appliances are configured to allow modules to be installed through a front of the network appliance or server. Front loading modules of various types can allow an administrator or technician to remove and/or replace modules without removing a server or network appliance from its place on a rack. Similarly, modules may be "hot swappable" in that they can be removed and inserted while a network appliance or server is still running and providing services. If fans or other airflow devices occupy too much area of a front or rear panel the number of front or rear loading devices may be reduced and/or the efficiency of airflow may be inhibited.

Applicants have recognized that increased compactness while maintaining sufficient airflow can lead to greater density and reduced cost. As such the applicants disclose herein a number of embodiments of servers and network appliances that have reduced depths but also allow for sufficient airflow and serviceability. In one embodiment, an airflow module stacked with one or more front loading modules reduces the depth of a chassis that is occupied almost solely by a fan or air plenum. The airflow module may be stacked with a storage module, I/O module, or any other module or device that generates heat. In one embodiment, the airflow module and one or more modules are stacked in a front compartment of a server or network appliance and one or more additional modules are mounted in a rear compartment of the server or network appliance. The airflow module may draw air in a front vent over a heat generating device and then force the air rearwardlly into a rear portion of a server or network appliance. The air may then exit through a rear vent. In one embodiment, the airflow module draws in air in a first direction and forces air rearwardly in a direction substantially orthogonal to the first direction. In one embodiment, the airflow module and the layout of other components in the front compartment may allow for vertical or a zig zag airflow, rather than simply front to back, that allows for sufficient airflow over heat generating devices within the front compartment but also allows for large amounts of front loading/front accessible devices or modules. In one embodiment, a front loading airflow module may draw in air within the front compartment into the front loading airflow module in a first direction and force air out of the front loading airflow module into the rear compartment in a second direction such that air is drawn in a front vent not on the airflow module, over the heat generating device of the front loading module, and forced rearward over rear heat generating devices and out a rear vent of the chassis. The first direction may be substantially orthogonal to the second direction.

The airflow module stacked with one or more modules and/or heat generating devices may allow for reduced server or network appliance depth. In some embodiments, a server or network appliance may have a depth of about 21 inches or less. In another embodiment, the server or network appliance may have a depth of about 20 inches or less. Reduced depth may allow for reduced rack sizes and may allow for an increase in density of servers or network appliances for the same floor space. Reduced depth may additionally or alternatively allow for increased isle size to increase serviceability. Additionally, due to the large area available on a front or rear panel for front or rear loading devices, aisle-way obstructions may be reduced even when deployed into existing telecommunications and data center environments. Certain embodiments eliminate chassis volume more typically dedicated to plenum space for cooling and thus enable reductions in costly communication center floor space otherwise required for similar network server and network appliance functions.

In some embodiments, an increased number of front or rear loading airflow, storage, and/or I/O modules can increase the complexity and capability of a single server or network appliance while increasing space utilization and performance. In some embodiments, dramatically reduced height and depth may result and allow for a high density, multiple processor, network communications server and network appliance device. The servers and network appliances may meet a variety of on common industry standards which may allow network appliances and servers disclosed herein to be deployed into highly constrained telecommunications central office environments in addition to more common lower performance data center environments.

Certain embodiments combine high capacity data storage with high compute power and high capacity high performance configurable input/output capability within a single compact enclosure suited for the highly constrained telecommunications central office environments in addition to more common lower performance data center environments. In certain embodiments, the reductions in size and combinations of features enables broader deployment to a wider range of high performance and high capacity mobile applications for medical, military and aerospace environments. Certain embodiments eliminate chassis volume more typically dedicated to plenum space for cooling thus enabling application and deployment in restricted spaces and extended operating environments of mobile medical data processing, mobile military data processing, and aerospace data processing. Certain embodiments significantly reduce the physical chassis size required to cool a similar set of features or general capabilities in existing products and even for high performance server and network appliance products. Certain embodiments establish a configurable internal connection architecture enabling reconfiguration and adaptation to a wide range of existing and potential front and rear input/output connectivity features and/or a wide variety of existing and potential mass storage devices.

Additional aspects and advantages will be apparent from the following detailed description of preferred embodiments, which proceeds with reference to the accompanying drawings.

Figure 1:
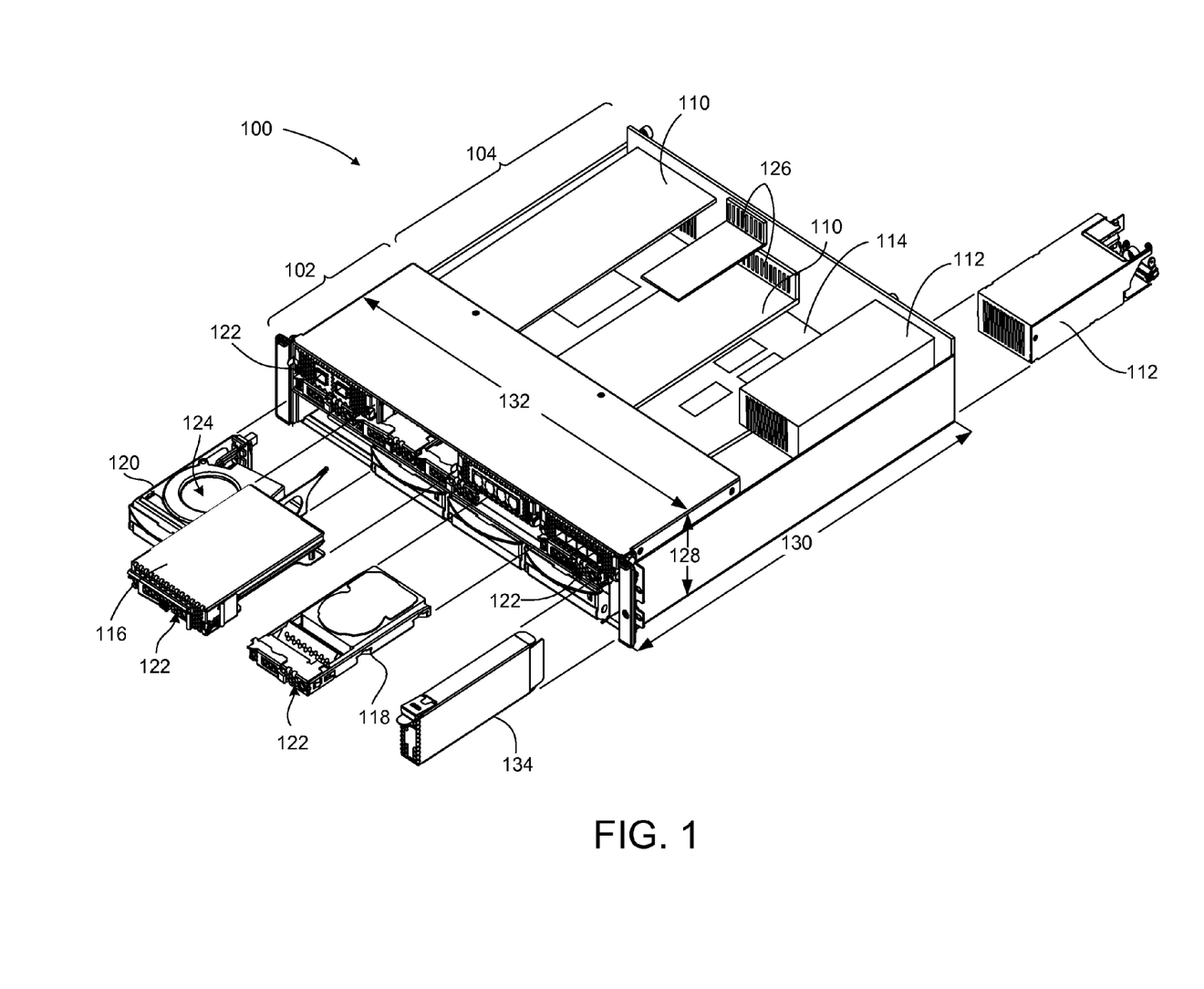
FIG. 1 schematically illustrates a first perspective view of a network appliance, according to one embodiment, with various accessible components at least partially removed for illustrative purposes.
Figure 2:
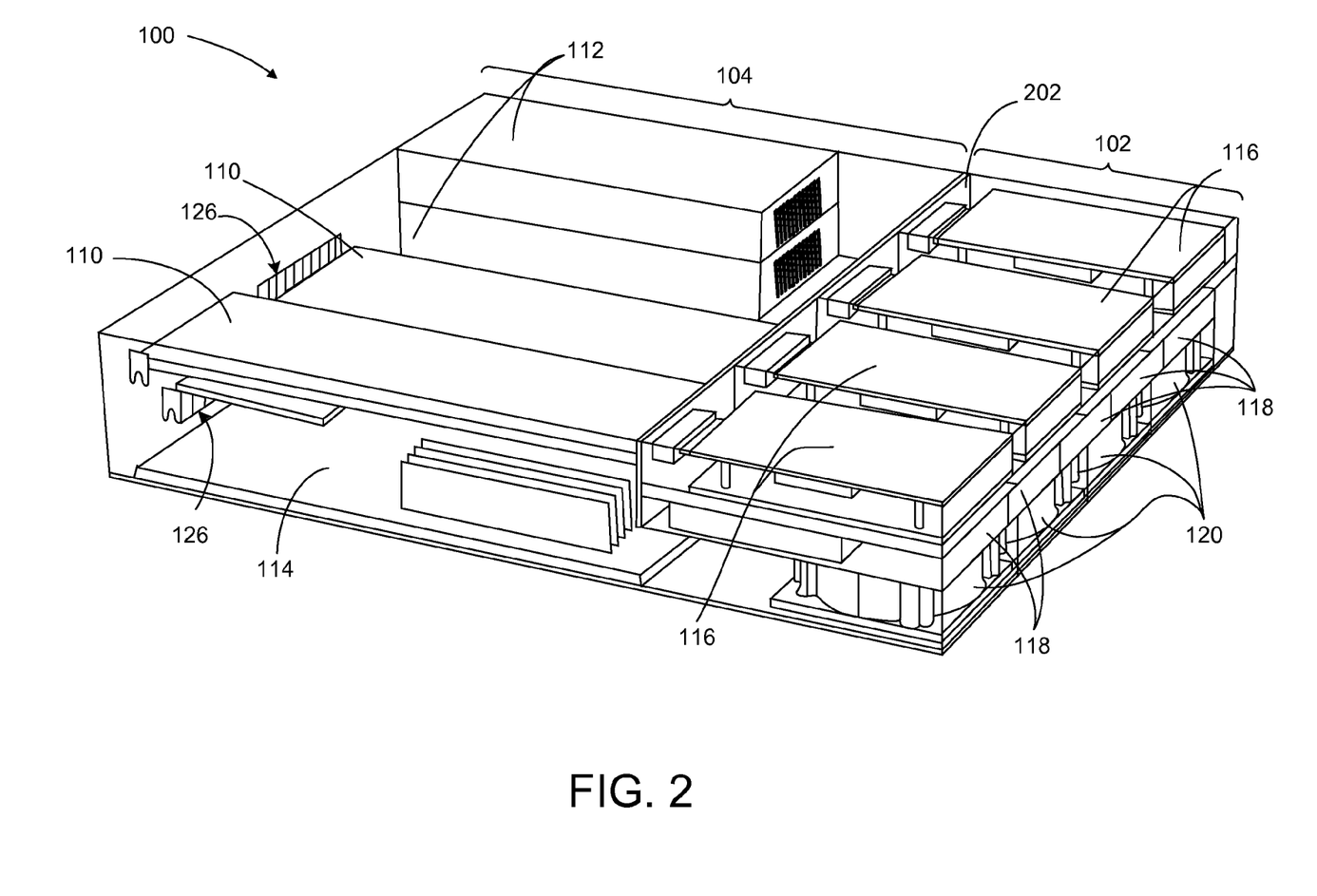
FIG. 2 schematically illustrates a second perspective view of the network appliance shown in FIG. 1 according to one embodiment.

FIGS. 1 and 2 illustrate one embodiment of a rack mount network appliance 100. The network appliance 100 includes a chassis with a front compartment 102 and a rear compartment 104 and is mountable within a network rack. The front compartment 102 and rear compartment 104 are configured to house one or more components including coprocessor modules 110, power supplies 112, a motherboard 114, I/O modules 116, storage modules 118, airflow modules 120, and slide out tray 134. Fewer or additional components may be included in other embodiments.

FIG. 1 is an isometric perspective view of the network appliance 100 with a cover over the rear compartment removed to expose the interior of the rear compartment 104. Additionally FIG. 1 illustrates a number of front loading components 116, 118, 120 removed from the front compartment 102 through a front end of the network appliance 100. FIG. 2 is a perspective view illustrating the interior of the network appliance 100 as if top and side covers of the network appliance 100 were removed. The components 116, 118, 120 are shown mounted within the front compartment 102 of the network appliance 100.

The network appliance 100 includes a chassis with a height 128, a depth 130, and a width 132. According to one embodiment, each of the height 128, depth 130, and width 132 may be standardized lengths. In one embodiment, the chassis may have a height 128, from top to bottom, of 2U or less. The chassis may include a depth 130, from front to back of twenty-one inches or less. In one embodiment, the chassis may include a depth 130 of twenty inches or less. The depths of the front compartment 102 and the rear compartment 104 may add up to be about the depth 130 of the chassis or less.

The front compartment 102 is proximal a front side of the chassis of the network appliance 100 and is configured to house a plurality of front loading modules 116, 118, 120. The front loading modules 116, 118, 120 may be front accessible and may be configured to plug-in or unplug from bays in the front of the network appliance 100. Thus, certain embodiments enable in situ front access for configuration and maintenance service of all input/output, mass storage and payload cooling modules. According to one embodiment, the front loading modules 116, 118, 120 are organized into airflow modules 120 on a first or bottom layer, storage modules 118, on a second middle layer, and I/O modules 116 on a third top layer. The layers, and thus the modules 116, 118, 120 are vertically stacked such that an airflow module 120 is substantially directly below a storage module 118 and/or an I/O module 116. Those skilled in the art will recognize, based on the present disclosure, that other types of devices may be included within the stack of devices at the front of the chassis, and/or that different types of devices may be included in one layer of the stack. For example, the top layer may include both I/O modules 116 and storage modules 118. Similarly, the layers may be rearranged such that the airflow modules 120 are on a top layer instead of a bottom layer.

In one embodiment, the front compartment 102 includes a depth sufficient to accommodate the modules 116, 118, and 120. For example, hard drives or other storage devices may have a standardized length and the front compartment 102 may include a depth sufficient to accommodate the devices. As another example, a fan or blower used in an airflow module 120, or a network interface card (NIC) or other communication card used in an I/O module 116 may have a standard length and the front compartment 102 may include a depth sufficient to accommodate the devices. In one embodiment, the front compartment 102 may include a depth to accommodate I/O modules 116, storage modules 118, and/or airflow modules 120 having lengths of about six inches.

The I/O module 116 may include a printed circuit board (PCB) or device that provides or expands I/O capabilities for the rack mount server. According to one embodiment, the device or devices on the PCB within the I/O modules 116 may generate heat as they perform their functions. The I/O modules 116 may include one or more ports for connecting a communications cable or wire and for transmitting or receiving signals over the cable or wire. For example, the I/O modules 116 may include ports to connect to an Ethernet, telephone, cable, fiber optic or other cable or wire. Of course, in one embodiment, an I/O module 116 may include an antenna and may be configured to communicate wirelessly.

The front loading I/O modules 116 may enable front panel plug-in service access to all front panel input/output connectivity and signal processing without requiring access to any other surface of the enclosure. For example, a top cover of the network appliance 100 may not need to be removed to access the I/O modules 116, which may be extremely important in some environments. Additionally, the front loading I/O modules 116 may be hot swappable which allow for plugging in and unplugging of I/O modules 116 without requiring interruption of unrelated applications running on the platform or network appliance 100.

In one embodiment, an I/O module 116 includes a front vent 122 that allows air to flow into or out of the front compartment 102 when the I/O module 116 is plugged in. For example, the front vent 122 on the front side of the chassis may be configured to allow air to flow between an external environment and the front compartment 102 to cool or otherwise circulate air through the network appliance 100. In other embodiments, the I/O modules 116 may not include any front vents 122 and the front vents 122 may be located on another module or on a front panel of the network appliance 100.

The storage modules 118 may include storage devices for storing data. For example, the storage modules 118 may include magnetic hard disk drives, solid state storage drives, tape drives, or any other type of digital or analog storage device known in the art. The storage modules 118 may be configured to expand or increase the storage capabilities of the network appliance 100. The storage modules 118 are configured to be plugged in and or un plugged through the front side of network appliance 100. The bays or slots into which the storage modules 118 may be inserted may include a variety of ports or connectors which may allow support for a wide variety of input/output and mass storage configurations and capacities. Similar to the I/O modules 116, the storage modules 118 may produce heat during operation.

Similar to the I/O modules 116, the storage modules 118 may include a front vent 122 that allows air to flow into or out of the front compartment 102 when a storage module 118 is plugged in. For example, the front vent 122 on the front side of the storage modules 118 may be configured to allow air to flow between an external environment and the front compartment 102 to cool or otherwise circulate air through the network appliance 100. In other embodiments, the storage modules 118 may not include any front vents 122 and the front vents 122 may be located on another module, such as an I/O modules 116, or on a front panel of the network appliance 100.

The airflow modules 120 are configured to move air through the network appliance 100. The airflow modules 120 may include any type of fan, blower, compressor, air pump, or other airflow device known in the art. According to one embodiment, the airflow modules 120 include airflow devices that can operate against a pressure differential. For example, some fans may not be able to move air very efficiently against air pressure that may be created within the network appliance 100. Other types of airflow devices, such as blowers or compressors are able to efficiently move air even against pressure build up within the network appliance 100. For example, high performance compact blowers may be used to provide high airflow rates through the front and rear compartments 102, 104. One skilled in the art will recognize considerable variation in the type of airflow device that may be used.

In one embodiment, the airflow modules 120 are front serviceable in that they can be plugged in and unplugged from the front of the network appliance 100. Additionally, the airflow modules 120 may each line the front of the network appliance 100 such that any one of the airflow modules 120 may be removed or inserted without removal or insertion of another module 120. According to one embodiment, the front serviceability provides for ease of replacement and may allow underperforming or failed airflow modules 120 to be replaced without affecting operation of the network appliance 100. Thus, certain embodiments enable front panel plug-in service access to all cooling components without requiring access to any other surface of the enclosure and without requiring disruption of or effect on applications running on the platform. In other embodiments, the airflow modules 120 may be fixed or not easily removable. For example, front or rear panel space of the chassis may, in certain scenarios, be better used for additional modules or interfaces.

The airflow modules 120 may be configured to draw air in from the front compartment 102 and force air into the rear compartment. Drawing air in from the front compartment 102 may cause air to be drawn in through front vents 122 of the I/O modules 116, storage modules 118, and/or chassis. The airflow modules 120 may then force the air into the rear compartment 104. The air may then flow out rear vents 126 of the rear compartment 104. The flow of air through the compartments 102, 104 may cause the devices and/or modules within the compartments 102, 104 to cool and thus stay at a safe and/or efficient operating temperature.

In one embodiment, the airflow modules 120 draw in air in a first direction and force air outward in a second direction that is orthogonal to the first direction. For example, the airflow modules 120 of the network appliance 100 of FIGS. 1 and 2 draws in air in a vertically downward direction through the inlet 124 and forces air horizontal and rearward through an outlet. Thus, the direction of the air is changed from a vertical to a horizontal direction.

According to one embodiment, the airflow module 120 does not include a vent between the exterior of the network appliance 100 and an interior of the network appliance 100. For example, the airflow module 120 may move air between the front compartment 102 and the rear compartment 104 rather than from an exterior of the network appliance 100 to an interior of the network appliance 100. This may allow for large vents on the front and rear sides of the network appliance 100 while still allowing for sufficient air flow and a large number of front and/or rear loading modules. Thus, air is forced to flow sequentially into a front compartment 102 through a vent, over one or more heat generating devices, through an airflow module 120 into a rear compartment 104 and out rear vents 126.

The slide out tray 134 may include one or more interfaces to allow for serviceability of the network appliance 100 from the front. In one embodiment, the slide out tray includes one or more of a USB port, serial port, or other port for interfacing with the network appliance 100. The slide out tray 134 may allow for front serviceability that may not otherwise be available if the whole front is occupied exclusively by I/O modules 116, storage modules 118, and/or airflow modules 120.

As depicted in FIGS. 1 and 2, the modules 116, 118, 120 may be vertically stacked to form layers. FIGS. 1 and 2 illustrate a first layer with four airflow modules 120, a second layer with five storage modules 118, and a third layer with four I/O modules 116. Front vents 122 on the storage and I/O modules 118, 116 are thus vertically offset from the airflow modules 120. This causes air to move in a vertical direction within the front compartment 102 because air is drawn in vents above the airflow modules 120, and downward and/or laterally into the airflow modules 120. In one embodiment, the interior of the front compartment 102 is configured to cause air drawn in the front vents 122 to pass over one or more heat generating devices before passing into the airflow modules 120. For example, the modules 116 and 118 may have shapes and walls configured to cause air to flow over hot devices before they the air is allowed to pass downward into the airflow module 120. In one embodiment, a heat generating device is disposed vertically between a front vent 122 and the airflow module 120. In another embodiment, the storage module 118 or I/O module 116 may be shaped to cause air to move laterally over a heat generating device before it can pass downward towards the I/O module 116.

For example, the network appliance 100 may include purpose designed and built mounting brackets for the I/O modules 116 and mass storage devices 118 that facilitate capture of cooling air from the environment, use a compartment of that flow to cool heat generating devices of the storage and I/O modules 116, 118 while redirecting the rest of the flow directly to the inlets 124 of the airflow modules 120. Thus, instead of positioning the various elements of the communications server or network appliance 100 in an in-line or serial sequence (e.g., from the front to the rear of the chassis) as is typically done, the disclosed embodiments stack and position front configurable plug-in I/O modules 116, storage devices 118, and airflow modules 120 in a way that eliminates the need for chassis depth 130 and internal volume allocated solely to provide an air inlet plenum for the finished product, including the front panel mounted features and the rear mounted coprocessor modules 110 and associated modules.

In one embodiment, a separating wall 202 separates at least a portion of the front compartment 102 from the rear compartment 104. The separating wall 202 and airflow modules 120 may substantially block the front compartment 102 off from the rear compartment 104. In one embodiment, most air that passes between the compartments 102, 104 must pass through the airflow modules 120. Thus, air within the front compartment 102 may be moved through the front compartment 102 until it is drawn into the airflow module 120 and forced into the rear compartment 104.

The depicted configuration provides a zero depth air plenum that still allows for sufficient airflow to cool components within the network appliance 100. The airflow module 120 because it is stacked with additional modules 116, 118 does not exclusively occupy any depth 130 of the network appliance 100. Similarly, the separating wall 202 is so thin that the air passage between the front compartment 102 and the rear compartment 104 is substantially zero depth and does not substantially increase the depth 130 of the network appliance 100.

The rear compartment 104 is proximal to a rear side of the chassis of the network appliance 100 and houses a motherboard 114, coprocessor modules 110, and power supplies 112. In one embodiment, the rear compartment 104 includes a depth sufficient to accommodate the coprocessor modules 110. For example, the coprocessor modules 110 may have a standardized length and the rear compartment 104 may include a depth sufficient to accommodate the devices. In one embodiment, the rear compartment 104 includes a depth to accommodate coprocessor modules 110 having lengths of about thirteen inches.

The coprocessor modules 110 may include processors to expand the processing capabilities of the network appliance 100. The coprocessor modules 110 may include a processor mounted on a PCB or on another host device. In other embodiments, rear I/O cards, graphics cards, or any other type of card may be installed in place of the coprocessor module 110. For example, the coprocessor module 110 may include a PCIe card or may be replaced by any type of standard PCIe card.

The coprocessor modules 110, or a replacement module or card, may be rear loading of top loading. In one embodiment, for example, the coprocessor modules 110 are accessible by moving a top cover that covers the rear compartment 104. This may require removal of the network appliance 100 from a rack, for example if another network appliance or server is mounted directly above the network appliance 100. In another embodiment, the coprocessor modules 110 may be installed from the rear of the network appliance 100. For example, the coprocessor modules 110 may be plugged in from a rear side of the case. This may not require removal of the top cover or a removal of the network appliance 100 from a rack.

The power supplies 112 include a first and second redundant supply. For example, in the case of failure of one of the power supplies 112 the other power supply may be able to handle the load until the failed power supply 112 is replaced.

The power supplies 112 are rear loading and may be mounted from the rear such that the power supplies 112 may be serviced without removing a top cover and/or removing the network appliance 100 from a rack.

The components within the rear compartment 104 may be cooled by air accelerated by the airflow modules 120 into the rear compartment 104. In one embodiment, the air exiting the airflow modules 120 is moving a high speeds and may pass over the motherboard 114, coprocessor modules 110, and/or power supplies 112 and be exhausted out rear vents 126. In one embodiment, the rear vents 126 may be placed for optimal cooling of heat generating devices.

Figure 3:
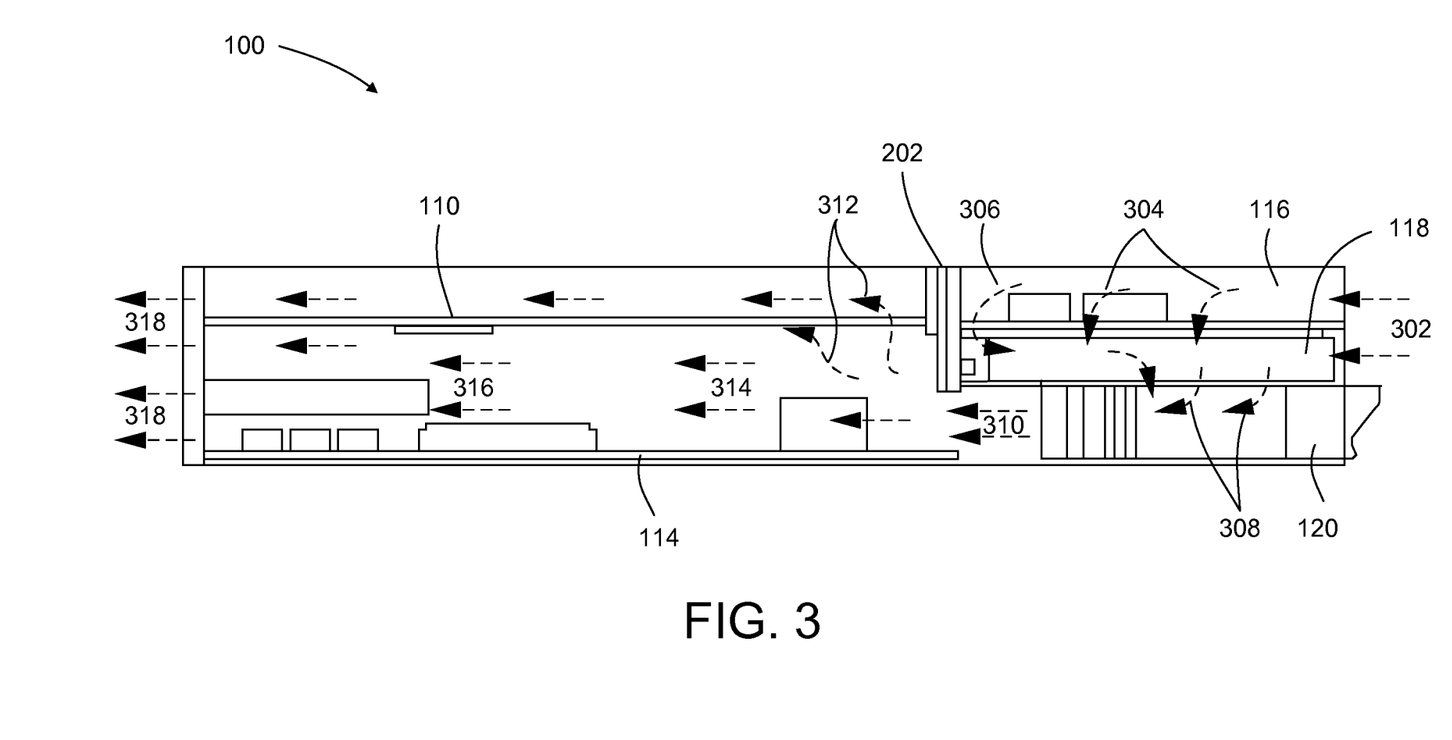
FIG. 3 schematically illustrates a side view the network appliance shown in FIGS. 1 and 2 according to one embodiment.

FIG. 3 is a cross sectional side view illustrating airflow through the network appliance 100 of FIGS. 1 and 2. Air enters a front of the chassis of the network appliance 100 through I/O module 116 and storage module 118 at arrows 302. Some of the airflow is ducted around sideways (into or out of FIG. 3) and down towards the airflow modules 120 as indicated at arrows 304. A good portion, and in one embodiment, a majority, of the air is ducted across a top of the devices before being ducted down (represented by arrows 306) to rejoin the rest of the flow as it enters the inlet 124 of the airflow module 120 at lines 308. The separating wall 202 may inhibit air from flowing into the second compartment 104 and rather be drawn down towards the airflow module 120. Thus, the air flowing into the network appliance 100 may pass over one or more heat generating devices before entering the airflow module 120. Although some air may come directly in at arrows 302 and pass directly or substantially directly to the airflow module 120, most of the air will be directed in an indirect path before entering the airflow module 120. For example, a majority of the air may loop around one or more heat generating devices, as at arrows 306 and 304 before passing into the airflow module 120.

In certain embodiments, air is drawn into the top of the airflow module 120 (as illustrated by arrows 308). Outlets of the airflow modules 120 face toward the rear of the chassis where air is accelerated into the rear compartment 104 as indicated by arrows 310. A portion of the accelerated air is directed upwards as indicated by arrows 312 to cool devices located higher in the network appliance 100 while some of the air continues as indicated by arrows 314 towards the rear in the lower portion. The air passes over devices on the coprocessor module 110 and the motherboard 114 as indicated by arrows 316 and cools them. The air is finally exhausted out the rear of the chassis at arrows 318. As the air moves through the network appliance 100 the velocity of the airflow may change. For example, airflow at arrows 310, 306 may be at peak velocities while airflow at arrows 302 and/or 314 may be at lower velocities.

The examples illustrated herein enable a front to rear airflow path in a low profile, limited depth, chassis (e.g., for telecommunications platforms), while still mounting a full complement of front panel based I/O modules 116 and storage modules 118. Thus, certain embodiments do not require undesired side, top or bottom air inlet vents. Further, certain embodiments do not increase product depth 130 that interferes with service access in fixed aisle depth telecommunications data centers or that consumes limited space in certain military and aerospace application environments.

Exemplary embodiments, such as that of FIGS. 1 and 2 may also allow for increased air inlet and/or outlet sizes. For example, the whole front panel, except for the front locations of the airflow modules 120 may be covered with vents. This may provide a much larger direct and dedicated airflow inlet for the airflow into the front panel. Additionally, inlet paths through the front I/O modules 116 and mass storage modules 118 may also provide for significant airflow inlet area. Similarly, because the airflow modules 120 may lie flat and/or change direction of air movement they may occupy a much smaller portion of the front side of the network appliance 100 while still maintaining large air inlets 124 on the airflow modules 120. The large amounts of airflow may be achieved without sacrificing front and/or rear loading capabilities for expansion modules.

According to one embodiment, 20 to 25% reduction or more in require floor space may be accomplished using teachings of the present disclosure. Sufficient airflow to cool the devices may still be maintained. In one embodiment, airflow is sufficient to meet requirements for network equipment-building system (NEBS) layer 3 compliance. In addition to airflow, the network appliances and servers described herein may be configured to meet or exceed all aspects of the NEBS layer 3 requirements.

In one embodiment, the network appliance 100 of FIGS. 1-3 is set up in only one possible configuration. For example, the network appliance 100 may be reconfigurable to change dimensions of the front compartment 102, rear compartment 104, or the location of any component or module. For example, certain embodiments define a set of internal backplane interconnection and mounting features that permit isolation of the front I/O modules 116 and mass storage 118 capabilities such that the physical configuration of the chassis can be readily modified at various stages of assembly or deployment to meet changes in application requirements over time and without impact to main chassis structure. For example, the dimensions of the compartments 102, 104 may be altered to adapt for new sizes of I/O modules 116, storage modules 118, coprocessor modules 110, airflow modules 120 or other components or modules.

The embodiments described herein may be suitable for a variety of uses and environments and may provide a variety of benefits that are not currently available. For example, certain embodiments provide a more compact chassis enclosure with a potentially larger number of configuration options with the high power dissipation capacity required for extended environment applications. For example, high value and extreme conditions encountered with telecommunications central offices, military environments, or others may benefit from the increased compactness and serviceability while still providing high level processing capabilities. The reduced size while still providing features typically required to enable extended reliability or fault tolerant continuous operation of the equipment may be desirable for extended operating within environments with non-ideal temperature ranges and that are subject to operating shock and vibration levels beyond those typical equipment with similar function are required to endure.

It will be obvious in light of the present disclosure to those having skill in the art that many changes may be made to the details of the above-described embodiments without departing from the underlying principles of the invention. The scope of the present invention should, therefore, be determined only by the following claims.

The invention claimed is:

1. A rack mount network appliance comprising:
   a chassis comprising a front compartment proximal a front side of the chassis and a rear compartment proximal a rear side of the chassis, the chassis to mount in a network rack;
   a front vent on the front side of the chassis that allows air to flow between an external environment and the front compartment;

a front loading module mountable in the front compartment and comprising a heat generating device; and a front loading airflow module that draws in air within the front compartment into the front loading airflow module in a first direction and forces air out of the front loading airflow module into the rear compartment in a second direction such that air is drawn in the front vent, over the heat generating device of the front loading module, and forced rearward over rear heat generating devices and out a rear vent of the chassis, wherein the first direction is substantially orthogonal to the second direction.

2. The rack mount network appliance of claim 1, wherein the first direction comprises a vertical direction and wherein the second direction comprises a substantially horizontal rearward direction.

3. The rack mount network appliance of claim 1, wherein the airflow module is vertically stacked in relation to the front loading module such that the front loading module is vertically offset from the front loading airflow module.

4. The rack mount network appliance of claim 1, wherein the airflow module is vertically offset from the front vent.

5. The rack mount network appliance of claim 4, wherein the heat generating device is disposed vertically between the front vent and an inlet of the airflow module.

6. The rack mount network appliance of claim 1, wherein a front side of the airflow module does not comprise a vent, the front side of the airflow module on the front side of the chassis when mounted in the chassis.

7. The rack mount network appliance of claim 1, wherein the front vent is located on a front side of the front loading module.

8. The rack mount network appliance of claim 1, wherein the chassis comprises a height of 2U or less.

9. The rack mount network appliance of claim 1, wherein the chassis comprises a depth of about twenty-one inches or less, the depth comprising a distance from the front side to the rear side.

10. The rack mount network appliance of claim 9, wherein the chassis comprises the depth of about twenty inches or less.

11. The rack mount network appliance of claim 9, wherein the front compartment comprises a depth of about six inches and wherein the rear compartment comprises a depth of about 13 inches.

12. The rack mount network appliance of claim 1, wherein the front loading airflow module and one or more additional front loading airflow modules comprise a first row, further comprising a second row, the second row comprising the front loading module and one or more additional front loading modules.

13. The rack mount network appliance of claim 11, wherein the front loading modules of the second row comprise one or more data storage modules.

14. The rack mount network appliance of claim 11, further comprising a third row of front loading modules.

15. The rack mount network appliance of claim 14, wherein the third row of front loading modules comprise vents.

16. The rack mount network appliance of claim 14, wherein the third row of front loading modules comprises one or more I/O modules.

17. The rack mount network appliance of claim 14, wherein the third row of front loading modules comprises one or more data storage modules.

18. The rack mount network appliance of claim 1, wherein the rack mount network appliance is network equipment-building system (NEBS) layer 3 compliant.

19. A rack mount network appliance comprising:

a chassis compartmentalized into a front compartment proximal a front side of the chassis and a rear compartment proximal a rear side of the chassis, the chassis houses one or more appliance components and is mounted in an appliance rack;

a front loading heat generating device mountable in the front compartment, the front loading heat generating device comprising a front vent such that with the front loading heat generating device mounted in the chassis air is allowed to flow through the front vent between an external environment and the front compartment; and a front loading airflow module that draws in air from the front compartment in a first direction and forces air into the rear compartment in a second direction such that air is drawn in the front vent, over the front loading heat generating device, and forced rearwardly over rear heat generating devices and out a rear vent of the chassis, wherein the first direction is substantially orthogonal to the second direction.

20. The rack mount network appliance of claim 19, wherein the first direction comprises a vertical direction and wherein the second direction comprises a substantially horizontal rearward direction.

21. The rack mount network appliance of claim 19, wherein the airflow module is vertically stacked in relation to the front loading heat generating device such that the front loading heat generating device is vertically offset from the front loading airflow module.

22. The rack mount network appliance of claim 19, wherein a front side of the airflow module does not comprise a vent, the front side of the airflow module on the front side of the chassis when mounted in the chassis.

23. The rack mount network appliance of claim 19, wherein the chassis comprises a height of 2U or less.

24. The rack mount network appliance of claim 19, wherein the chassis comprises a depth of about twenty-one inches or less, the depth comprising a distance from the front side to the rear side.

* * * * *